(12) United States Patent
Cheng et al.

(10) Patent No.: US 10,832,962 B1
(45) Date of Patent: Nov. 10, 2020

(54) FORMATION OF AN AIR GAP SPACER USING SACRIFICIAL SPACER LAYER

(71) Applicant: International Business Machines Corporation, Armonk, NY (US)

(72) Inventors: Kangguo Cheng, Schenectady, NY (US); Peng Xu, Santa Clara, CA (US); ChoongHyun Lee, Rensselaer, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/419,551

(22) Filed: May 22, 2019

(51) Int. Cl.
*H01L 21/8234* (2006.01)
*H01L 29/66* (2006.01)
*H01L 29/06* (2006.01)

(52) U.S. Cl.
CPC ........... *H01L 21/823468* (2013.01); *H01L 21/823431* (2013.01); *H01L 21/823475* (2013.01); *H01L 29/0649* (2013.01); *H01L 29/6656* (2013.01); *H01L 29/66553* (2013.01)

(58) Field of Classification Search
None
See application file for complete search history.

(56) References Cited

U.S. PATENT DOCUMENTS

| | | | |
|---|---|---|---|
| 6,891,235 B1 | 5/2005 | Furukawa et al. | |
| 9,330,899 B2 | 5/2016 | Jung et al. | |
| 9,362,355 B1 | 6/2016 | Cheng et al. | |
| 9,691,620 B2 | 6/2017 | Toriumi et al. | |
| 9,721,897 B1 | 8/2017 | Cheng et al. | |
| 2008/0265377 A1 | 10/2008 | Clevenger et al. | |
| 2015/0243544 A1* | 8/2015 | Alptekin | H01L 29/6653 438/586 |
| 2016/0359046 A1 | 12/2016 | Cheng et al. | |
| 2018/0158818 A1* | 6/2018 | Bergendahl | H01L 29/4966 |

(Continued)

OTHER PUBLICATIONS

K. Cheng et al., "Air Spacer for 10nm FinFET CMOS and Beyond," IEEE International Electron Devices Meeting (IEDM), Dec. 3-7, 2016, 4 pages.

(Continued)

*Primary Examiner* — Nilufa Rahim
(74) *Attorney, Agent, or Firm* — Robert Sullivan; Ryan, Mason & Lewis, LLP (57) ABSTRACT

A method for manufacturing a semiconductor device includes forming a plurality of gate structures on a semiconductor fin, and forming a plurality of source/drain regions adjacent the gate structures. A sacrificial spacer layer is deposited on the source/drain regions, and part of the sacrificial spacer layer is removed to expose portions of the source/drain regions. A plurality of source/drain contacts are formed on the source/drain regions, wherein remaining portions of the sacrificial spacer layer are positioned between the source/drain contacts and adjacent ones of the gate structures. The method also includes removing the remaining portions of the sacrificial spacer layer to form a plurality of spaces between the source/drain contacts and the adjacent ones of the gate structures. The removal of the remaining portions of the sacrificial spacer layer is performed using a water-based etch. A dielectric material including a plurality of air gaps is deposited in the spaces.

18 Claims, 9 Drawing Sheets

(56) References Cited

U.S. PATENT DOCUMENTS

2018/0166553 A1\* 6/2018 Lee .................. H01L 21/76897
2020/0105909 A1\* 4/2020 Wu ....................... H01L 29/785

OTHER PUBLICATIONS

H. Mahfoz-Kotb et al., "High Performance Polysilicon Air-Gap Thin Film Transistor on Low Temperature Substrates," Proceedings of SPIE, Smart Sensors, Actuators, and MEMS, Apr. 24, 2003, pp. 168-175, vol. 5116.
C.H. Lee et al., "Oxygen Potential Engineering of Interfacial Layer for Deep Sub-nm EOT High-k Gate Stacks on Ge," IEEE International Electron Devices Meeting (IEDM), Dec. 9-11, 2013, 4 pages.

\* cited by examiner

FORMATION OF AN AIR GAP SPACER USING SACRIFICIAL SPACER LAYER

BACKGROUND

Semiconductor devices, such as, for example, complementary metal-oxide semiconductor (CMOS) devices are continuously being scaled down to smaller dimensions. As components are scaled down and transistors are being formed closer together, the parasitic capacitance between gates and source/drain regions increases, which undesirably reduces circuit speed. Conventional dielectric spacers formed between conducting elements are not able to adequately prevent charge build up and crosstalk at the smaller scales.

Replacing at least portions of the spacer material with regions of air significantly reduces parasitic capacitance. Conventional methods for forming spacers with air regions (air gap spacers) utilize oxygen ($O_2$) based etching, which may damage gate structures.

Accordingly, there is a need for improved air gap spacer structures and fabrication techniques for forming the air gap spacers which minimize or prevent damage to surrounding structures such as gate stacks.

SUMMARY

According to an exemplary embodiment of the present invention, a method for manufacturing a semiconductor device includes forming a plurality of gate structures on a semiconductor fin, and forming a plurality of source/drain regions adjacent the gate structures. In the method, a sacrificial spacer layer is deposited on the source/drain regions, and part of the sacrificial spacer layer is removed to expose portions of the source/drain regions. A plurality of source/drain contacts are formed on the source/drain regions, wherein remaining portions of the sacrificial spacer layer are positioned between the source/drain contacts and adjacent ones of the gate structures. The method also includes removing the remaining portions of the sacrificial spacer layer to form a plurality of spaces between the source/drain contacts and the adjacent ones of the gate structures. The removal of the remaining portions of the sacrificial spacer layer is performed using a water-based etch. A dielectric material is deposited in the spaces and includes a plurality of air gaps.

According to an exemplary embodiment of the present invention, a method for manufacturing a semiconductor device includes forming a plurality of gate structures on a semiconductor fin, and forming a plurality of source/drain regions on sides of the plurality of gate structures. In the methods, a sacrificial spacer layer is conformally deposited on the plurality of source/drain regions and on the plurality of gate structures. The sacrificial spacer layer includes germanium oxide. Part of the sacrificial spacer layer is removed, wherein the removal exposes portions of the plurality of source/drain regions. The method also includes forming a plurality of source/drain contacts on the plurality of source/drain regions, wherein remaining portions of the sacrificial spacer layer are positioned between the plurality of source/drain contacts and adjacent ones of the plurality of gate structures. The remaining portions of the sacrificial spacer layer are removed to form a plurality of spaces between the plurality of source/drain contacts and the adjacent ones of the plurality of gate structures, and a dielectric material is non-conformally deposited in the plurality of spaces and on the plurality of source/drain contacts. The dielectric material includes a plurality of air gaps.

According to an exemplary embodiment of the present invention, a method for manufacturing a semiconductor device includes forming a plurality of gate structures on a semiconductor layer, and forming a plurality of source/drain regions adjacent the plurality of gate structures. In the method, a sacrificial spacer layer is deposited on the plurality of source/drain regions, and part of the sacrificial spacer layer is removed to expose portions of the plurality of source/drain regions. A plurality of source/drain contacts are formed on the plurality of source/drain regions, wherein remaining portions of the sacrificial spacer layer are positioned between the plurality of source/drain contacts and adjacent ones of the plurality of gate structures. The method also includes removing the remaining portions of the sacrificial spacer layer to form a plurality of spaces between the plurality of source/drain contacts and the adjacent ones of the plurality of gate structures. The removal of the remaining portions of the sacrificial spacer layer is performed using a water-based etch. A dielectric material is non-conformally deposited in the plurality of spaces and on plurality of source/drain contacts. The dielectric material includes a plurality of air gaps.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

Exemplary embodiments of the invention will now be discussed in further detail with regard to semiconductor devices and methods of manufacturing same and, in particular, to using a sacrificial layer that can be etched by deionized (DI) water when forming air gap spacers.

It is to be understood that the various layers and/or regions shown in the accompanying drawings are not drawn to scale, and that one or more layers and/or regions of a type commonly used in, for example, field-effect transistor (FET), fin field-effect transistor (FinFET), vertical transport field-effect transistor (VTFET), CMOS, nanowire FET, nanosheet FETs, metal-oxide-semiconductor field-effect transistor (MOSFET), single electron transistor (SET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not necessarily be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, FETs, FinFETs, VTFETs, CMOSs, nanowire FETs, nanosheet FETs, SETs, and/or MOSFETs. By way of non-limiting example, the semiconductor devices can include, but are not necessarily limited to FET, FinFET, VTFET, CMOS, nanowire FET, nanosheet FET, SET, CMOS and MOSFET devices, and/or semiconductor devices that use FET, FinFET, VTFET, CMOS, nanowire FET, nanosheet FET, SET, CMOS and/or MOSFET technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional views, and "horizontal" refers to a direction parallel to the top surface of the substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

As used herein, "high-k" refers to dielectric materials having a relative dielectric constant greater than 7.

As used herein, "low-k" refers to dielectric materials having a relative dielectric constant less than 7, and includes ultra-low-k dielectric materials.

In accordance with one or more embodiments, airgap spacers are formed by employing conformally deposited germanium oxide ($GeO_2$) as sacrificial spacer layers. The sacrificial spacer layers are able to be removed without $O_2$ based etching, which prevents or minimizes damage to surrounding structures, such as, for example, gate stacks. In addition, the embodiments eliminate the use of a liner layer on source/drain regions prior to dummy gate removal and gate structure formation.

The conformally deposited $GeO_2$ is formed in trenches over source/drain regions and patterned prior to formation of source/drain contacts in the trenches. Following source/drain contact formation, the sacrificial $GeO_2$ is removed with a water-based etching process, such as with a DI water etch, and replaced with a non-conformally deposited dielectric layer, which is pinched-off during deposition to form the air gap spacers adjacent the source/drain contacts. The air gap spacers are spacers having air gaps within the spacer structure. The dielectric constant of air (1.00059 at 1 atm) is close to the dielectric constant of a vacuum, which is 1.

The cross-sections in FIGS. 1-18 are taken parallel to the length of fins.

Figure 1:
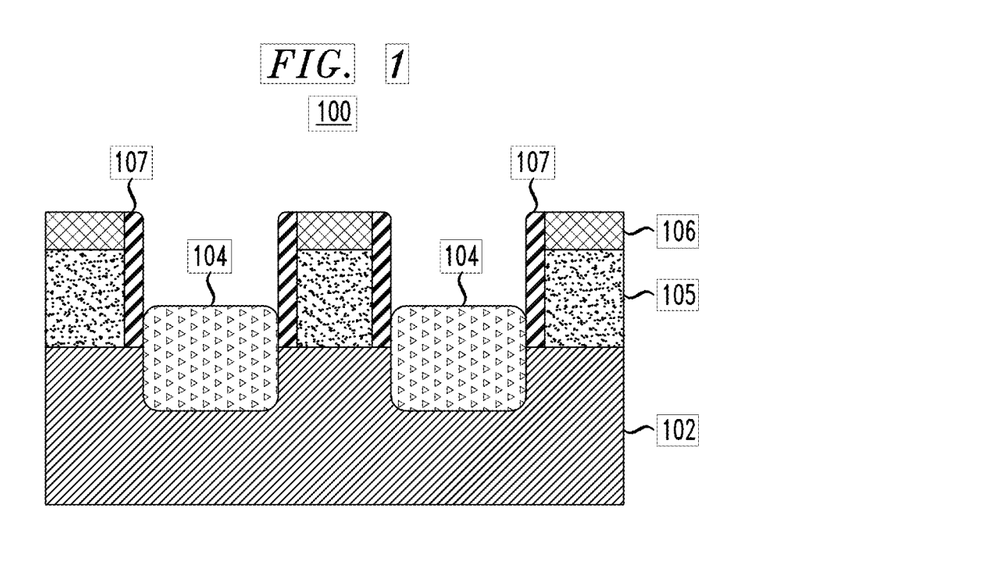
FIG. 1 is a cross-sectional view illustrating dummy gates and source/drain regions on a fin in a method of manufacturing a semiconductor device, according to an exemplary embodiment of the present invention.

Referring to FIG. 1 a plurality of dummy gates 105 and source/drain regions 104 are formed on a fin 102. The fin can be formed on a semiconductor substrate (not shown). A semiconductor substrate includes semiconductor material including, but not limited to, silicon (Si), silicon germanium (SiGe), silicon carbide (SiC), Si:C (carbon doped silicon), silicon germanium carbide (SiGeC), carbon doped silicon germanium (SiGe:C), II-VI compound semiconductor or other like semiconductor. In addition, multiple layers of the semiconductor materials can be used as the semiconductor material of the substrate. The semiconductor substrate can be a bulk substrate or a semiconductor-on-insulator substrate such as, but not limited to, a silicon-on-insulator (SOI), silicon-germanium-on-insulator (SGOI) or III-V-on-insulator substrate including a buried insulating layer, such as, for example, a buried oxide or nitride layer.

Fins, such as fin 102, can be formed by patterning a portion of the semiconductor substrate or a semiconductor layer on the substrate into the fins. According to an embodiment, a hardmask including, for example, a dielectric material, such as silicon nitride (SiN), is formed on portions of the semiconductor layer that are to be formed into the fins. The fin patterning can be done by various patterning techniques, including, but not necessarily limited to, directional etching and/or a sidewall image transfer (SIT) process, for example. While the embodiments describe channel regions as fins, the embodiments are not necessarily limited to fin channel regions, and may include, for example, nanowire channel regions. FIGS. 1-18 illustrate one fin 102. Although one fin 102 is shown in the figures for ease of explanation, it is to be understood that multiple fins can be formed on a substrate and processed similarly or the same as the illustrated devices 100 and 200.

As is known in the art, channels can comprise, for example, silicon, and are conducting channels that extend in a direction from a source to a drain. A fin of a FinFET protrudes vertically from a substrate and extends in a direction from a source to a drain. A nanowire can be suspended and extend between a source and a drain. As can be understood by one of ordinary skill in the art, a plurality of fins or nanowires can be formed on a substrate and spaced apart from each other at regular intervals along a gate extension direction. A plurality of gates can intersect the fins or nanowires and extend perpendicular to the extension direction of the fins or nanowires. Multiple gates can be spaced apart from each other along the extension direction of the fins or nanowires.

A sacrificial material, which is replaced by gate structures, forms the dummy gates 105, which are used to determine a geometry and location of the resulting gate structures. The dummy gates 105 can comprise a material that can be selectively etched with respect to adjacent layers. For example, the dummy gates 105 may comprise silicon, such as, polysilicon or amorphous silicon, and may be deposited and patterned. The dummy gates 105 can be deposited using a deposition technique including, but not necessarily limited to, chemical vapor deposition (CVD), plasma-enhanced CVD (PECVD), radio-frequency CVD (RFCVD), physical vapor deposition (PVD), atomic layer deposition (ALD), molecular beam deposition (MBD), pulsed laser deposition (PLD), and/or liquid source misted chemical deposition (LSMCD), sputtering, and/or plating. Cap layers 106, comprising for example, silicon nitride (SiN), boron nitride (BN), silicon boron nitride (SiBN), silicon boron carbon nitride (SiBCN) or multilayered stacks thereof, are formed on the dummy gates 105.

Gate spacers 107 are formed adjacent to the dummy gates 105 including the cap layers 106 thereon. The gate spacers 107 are in direct contact with opposing sidewalls of the dummy gates 105. The gate spacers 107 can include a dielectric insulating material such as, for example, silicon oxide ($SiO_x$) (x is, for example, 1.99, 2, 2.01), carbon doped silicon oxide (SiOC), SiN, silicon oxynitride (SiON), carbon doped silicon oxynitride (SiOCN), BN, SiBN, SiBCN or multilayered stacks thereof.

Source/drain regions 104 are formed adjacent to the spacers 107 by epitaxial growth with in-situ doping or by dopant implantation. The source/drain regions 104 may comprise semiconductor material including, but not limited to, Si, SiGe, SiC, SiGeC or other like semiconductor with dopants, such as, boron, phosphorus, arsenic and any other applicable elements, depending on whether the source/drain regions are n-type or p-type regions. Similarly, the material of the fin 102 may vary depending on whether the resulting transistors are n-type or p-type devices.

Terms such as "epitaxial growth and/or deposition" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth processes include, for example, rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for an epitaxial deposition process can range from 500° C. to 900° C.

A number of different sources may be used for the epitaxial growth of the compressively strained layer. In some embodiments, a gas source for the deposition of epitaxial semiconductor material includes a silicon containing gas source, a germanium containing gas source, or a combination thereof. For example, an epitaxial silicon layer may be deposited from a silicon gas source including, but not necessarily limited to, silane, disilane, trisilane, tetrasilane, hexachlorodisilane, tetrachlorosilane, dichlorosilane, trichlorosilane, and combinations thereof. An epitaxial germanium layer can be deposited from a germanium gas source including, but not necessarily limited to, germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

Figure 2:
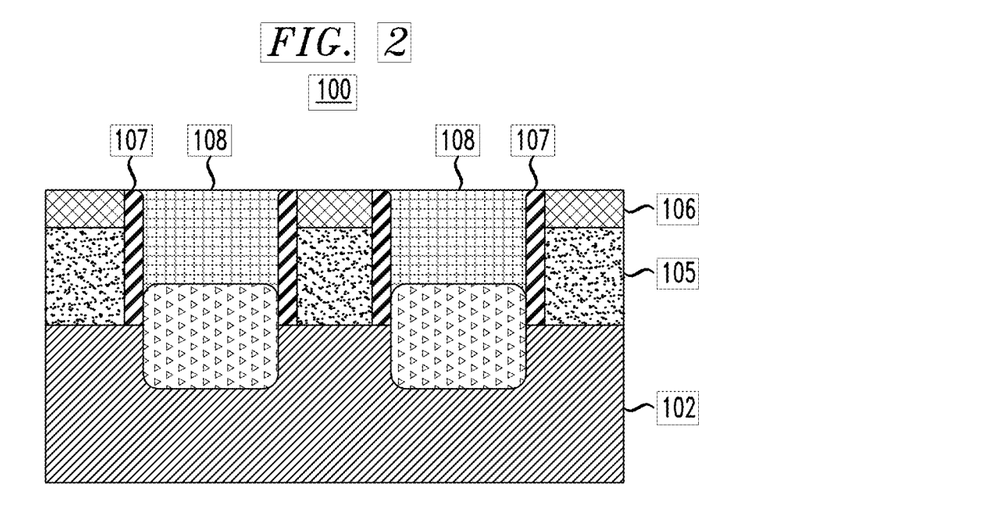
FIG. 2 is a cross-sectional view illustrating deposition and planarization of an inter-layer dielectric (ILD) layer in a method of manufacturing a semiconductor device, according to an exemplary embodiment of the present invention.

Referring to FIG. 2, an ILD layer 108 is deposited on the source/drain regions 104 adjacent the dummy gates 105. The ILD layer 108 can be deposited using, for example, a deposition technique such as, but not necessarily limited to, CVD, PECVD, RFCVD, PVD, ALD, MBD, PLD, LSMCD, sputtering, and/or plating, followed by planarization down to the cap layers 106 using, for example, a planarization process such as, chemical mechanical polishing (CMP). According to an embodiment, the ILD layer is deposited directly on the source/drain regions 104. The ILD layer 108 may comprise, but is not necessarily limited to, $SiO_x$, SiOC or some other dielectric.

Figure 3:
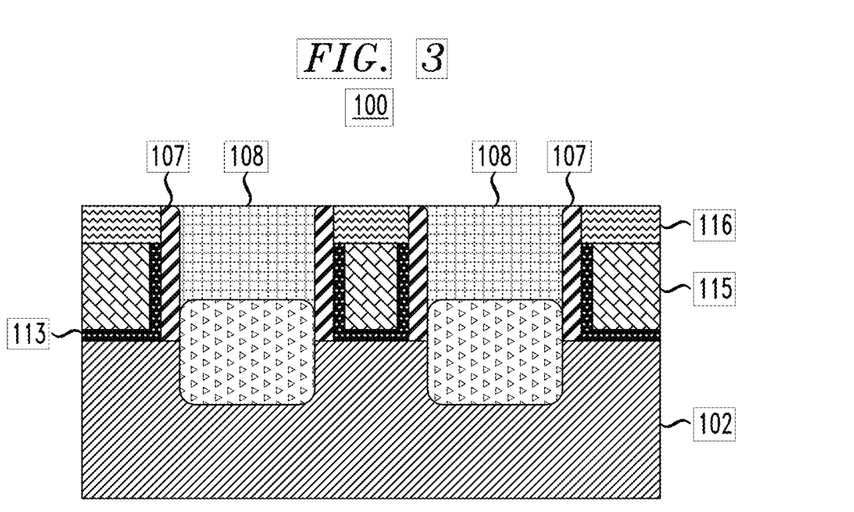
FIG. 3 is a cross-sectional view illustrating dummy gate removal and gate structure formation in a method of manufacturing a semiconductor device, according to an exemplary embodiment of the present invention.

Referring to FIG. 3, the dummy gates 105 and cap layers 106 are removed and replaced with gate structures comprising a gate dielectric and gate conductor layers 113 and 115. Cap layers 116 are formed on the gate structures. The gate dielectric layers 113 include, for example, high-k dielectric layers formed on exposed surfaces of the gate spacers 107 and the fin 102. The high-k dielectric layers are formed of, for example, high-k materials including, but not necessarily limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials may further include dopants such as lanthanum, aluminum, magnesium. The high-k dielectric material can be formed by any suitable process or any suitable combination of multiple processes, including but not necessarily limited to, thermal oxidation, chemical oxidation, thermal nitridation, plasma oxidation, plasma nitridation, ALD, CVD, etc. In some embodiments, the high-k dielectric layers have a thickness ranging from about 1 nm to about 5 nm, although less and greater thicknesses are also possible.

The gate structures further include a gate conductor layer 115 formed on the gate dielectric (e.g., high-k) layer 113. The gate conductor layers 115 can comprise any suitable conducting material, including but not necessarily limited to, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au)), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (NiSi)), transition metal aluminides (e.g. $Ti_3Al$, ZrAl), TaC, TaMgC, carbon nanotube, conductive carbon, graphene, or any suitable combination of these materials. The conductive material may further comprise dopants that are incorporated during or after deposition. In some embodiments, the gate structures may further comprise a work function setting layer between a gate dielectric 113 and a gate conductor 115. The work function setting layer can be a work function metal (WFM). WFM can be any suitable material, including but not limited to, a nitride, including but not limited to, titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to, titanium carbide (TiC) titanium aluminum carbide (TiAlC), tantalum carbide (TaC), hafnium carbide (HfC), and combinations thereof. In some embodiments, a conductive material or a combination of multiple conductive materials can serve as both gate conductor 115 and WFM. The gate conductor 115 and WFM can be formed by any suitable process or any suitable combination of multiple processes, including but not limited to, ALD, CVD, PVD, sputtering, plating, evaporation, ion beam deposition, electron beam deposition, laser assisted deposition, chemical solution deposition, etc. The gate structures function as gate electrodes in an operational device. nFET and pFET devices may have different WFMs.

Similar to the cap layers 106, the cap layers 116 comprise, for example, SiN, BN, SiBN, SiBCN or multilayered stacks thereof, and are formed on the gate structures. A planarization process such as, for example, CMP, is performed following deposition of the cap layers 116.

Figure 4:
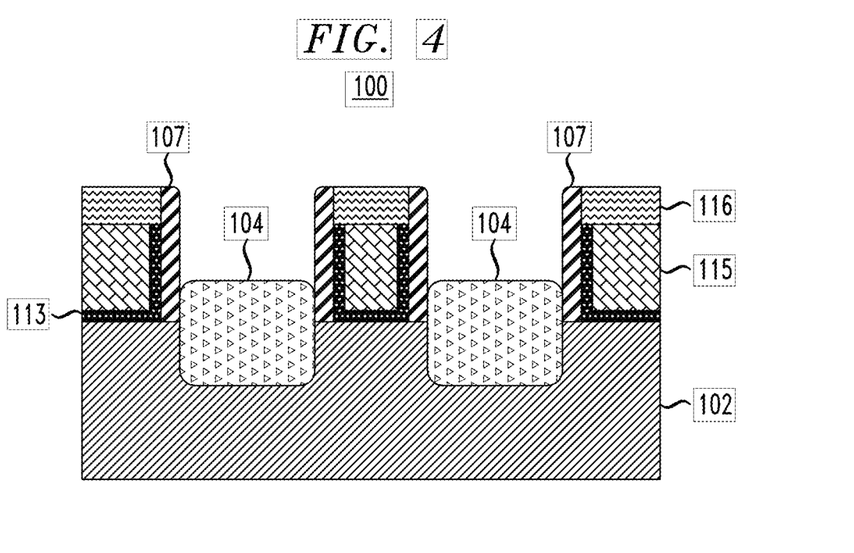
FIG. 4 is a cross-sectional view illustrating ILD removal over source/drain regions in a method of manufacturing a semiconductor device, according to an exemplary embodiment of the present invention.

Referring to FIG. 4, the ILD layer 108 is selectively removed over the source/drain regions 104 to expose the source/drain regions 104. The ILD layer 108 is removed using an etch process, such as, for example, reactive ion etching (RIE). The RIE process can be performed with, for example, fluorine-based gases such as, but not necessarily limited to, $CF_4$, $SF_6$, and $CHF_3$. The removal of the ILD layer 108 as shown in FIG. 4 opens a trench over the source/drain regions 104. The source/drain regions 104 are located adjacent the gate structures on lateral sides of the gate structures.

Figure 5:
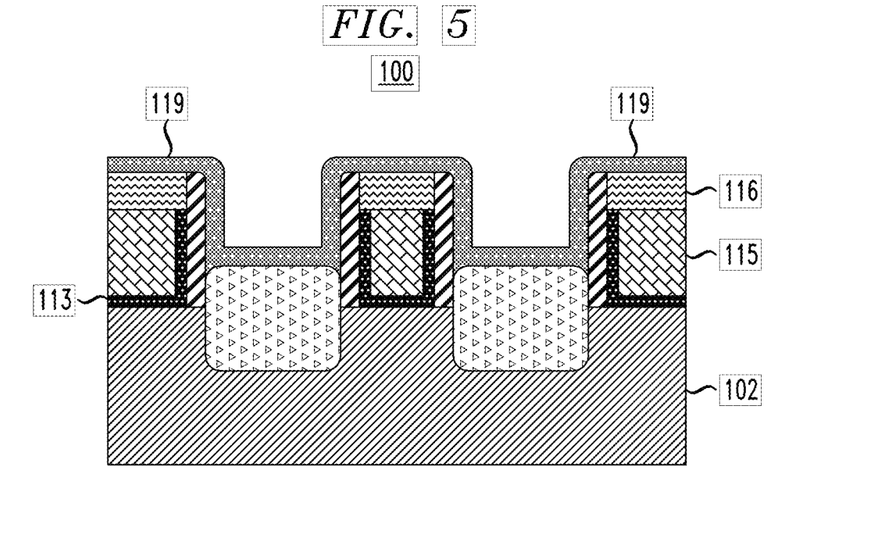
FIG. 5 is a cross-sectional view illustrating sacrificial spacer layer deposition in a method of manufacturing a semiconductor device, according to an exemplary embodiment of the present invention.

Referring to FIG. 5, a sacrificial spacer layer 119 is conformally deposited on the cap layers 116, gate spacers 107 and the source/drain regions 104. According to an embodiment, the sacrificial spacer layer 119 comprises, for example, $GeO_2$, which has a relatively high etch rate in DI water. According to one or more embodiments, other water soluble compounds may be used as the sacrificial spacer layer, including, for example, germanium oxynitride (GeON) and metal species doped $GeO_x$. The sacrificial spacer layer 119 is deposited using a conformal deposition technique such as, but not necessarily limited to, ALD or CVD. As can be seen in FIG. 5, the sacrificial spacer layer 119 is formed on vertical sides of gate spacers 107 and on horizontal top surfaces of the source/drain regions 104. A thickness of the sacrificial spacer layer 119 is about 2 nm to about 10 nm.

Figure 6:
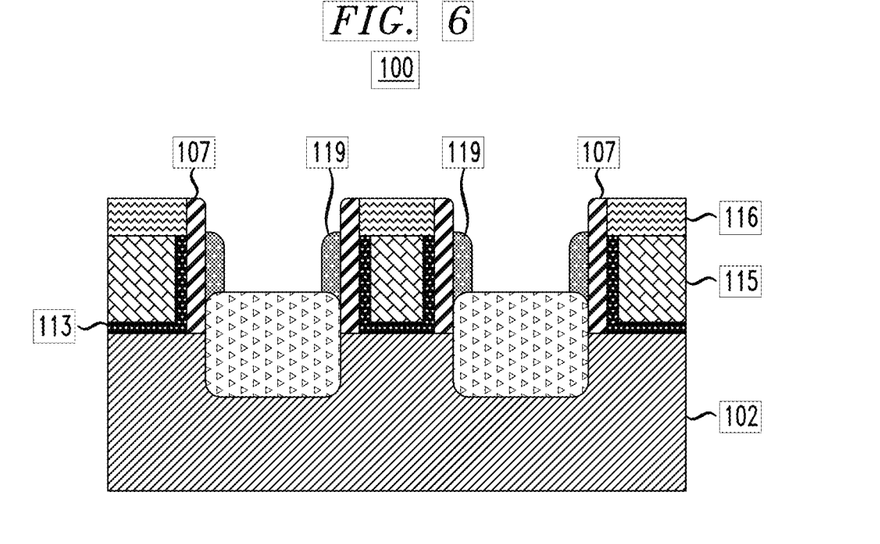
FIG. 6 is a cross-sectional view illustrating removal of portions of the sacrificial spacer layer, according to an exemplary embodiment of the present invention.

Referring to FIG. 6, portions of the sacrificial spacer layer 119 are removed to pattern the sacrificial spacer layer 119.

For example, using a directional RIE process, horizontal portions of the sacrificial spacer layer 119 are removed. The ME is continued to pull down the remaining vertical side portions of the sacrificial spacer layer 119 to a vertical height below the top surfaces of the gate spacer and cap layers 107 and 116. The ME is performed to remove the horizontal portions and to pull down the remaining side portions of the sacrificial spacer layer 119. As explained in more detail in connection with FIG. 7, the remaining vertical side portions of the sacrificial spacer layer 119 are pulled down to a vertical height below the top surfaces of the gate spacer and cap layers 107 and 116 so that subsequently deposited source/drain contact structures 120 cover the remaining vertical side portions of the sacrificial spacer layer 119 to protect them from being etched by any intervening processes (e.g., between FIGS. 7 and 8) that use DI water.

Figure 7:
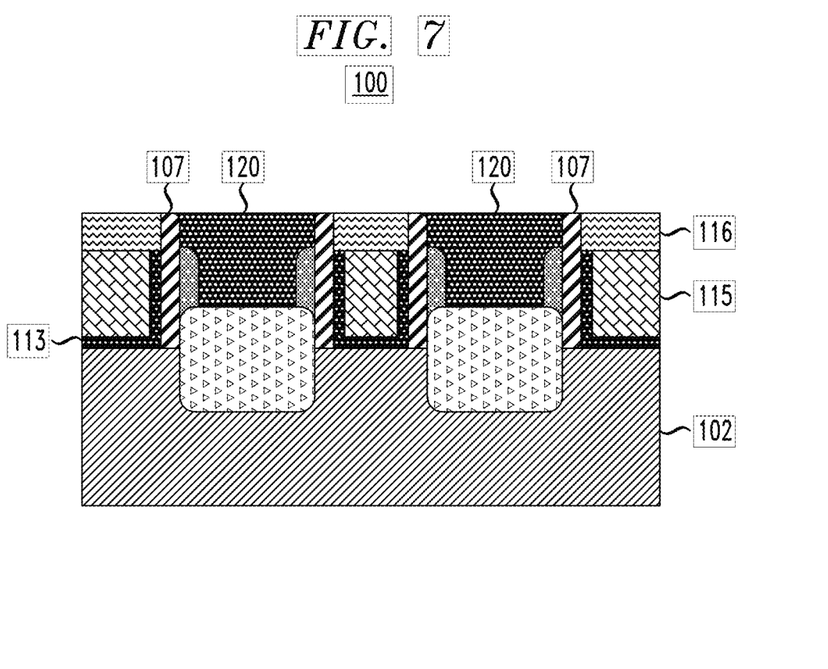
FIG. 7 is a cross-sectional view illustrating source/drain contact formation in a method of manufacturing a semiconductor device, according to an exemplary embodiment of the present invention.
Figure 8:
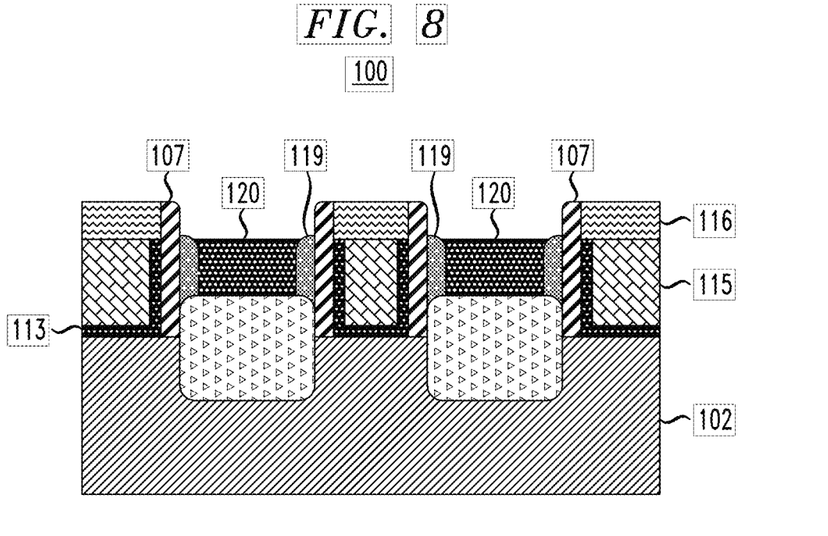
FIG. 8 is a cross-sectional view illustrating recessing of source/drain contacts to expose the remaining portions of the sacrificial spacer layer in a method of manufacturing a semiconductor device, according to an exemplary embodiment of the present invention.

Referring to FIG. 7, source/drain contact structures 120 are formed over the source/drain regions 104 and the remaining portions of the sacrificial spacer layer 119. The source/drain contact structures 120 include contact material, such as, for example, electrically conductive material including, but not necessarily limited to, tungsten, cobalt, zirconium, tantalum, titanium, aluminum, ruthenium, and/or copper. A silicide/germanide liner layer may be formed on the portions of the sacrificial spacer layer 119 and source/drain regions 104 by, for example, silicidation (e.g., formation of an alloy including a portion of a contact material with an underlying silicon or germanium layer) before filling the trenches over the source/drain regions 104 with a remainder of electrically conductive material. The electrically conductive material of the source/drain contact structures 120 can be deposited using, for example, a deposition technique, such as CVD, PECVD, RFCVD, PVD, ALD, MBD, PLD, LSMCD, sputtering, and/or plating, followed by planarization down to the cap layers 116 using, for example, a planarization process such as, CMP. As noted above, the source/drain contact structures 120 cover the remaining pulled-down vertical side portions of the sacrificial spacer layer 119, which protects the remaining pulled-down vertical side portions of the sacrificial spacer layer 119 from exposure to DI water, which is used during the CMP process. Accordingly, DI water from the CMP process does not etch the covered portions of the sacrificial spacer layer 119, which, according to an embodiment, are formed of $GeO_2$.

Referring to FIG. 8, the source/drain contact structures 120 are selectively recessed to expose the remaining portions of the sacrificial spacer layer 119. Recessing of the source/drain contact structures 120 is performed using, for example, selective metal RIE to selectively remove an upper portion of each of the source/drain contact structures 120 with respect to the cap and gate spacer layers 116, 107. The recessing is performed so that upper surfaces of the sacrificial spacer layer portions are exposed. According to an embodiment, a recessed vertical height of the source/drain contact structures 120 with respect to the underlying source/drain contact regions 104 is about 10 nm to about 100 nm.

Figure 9:
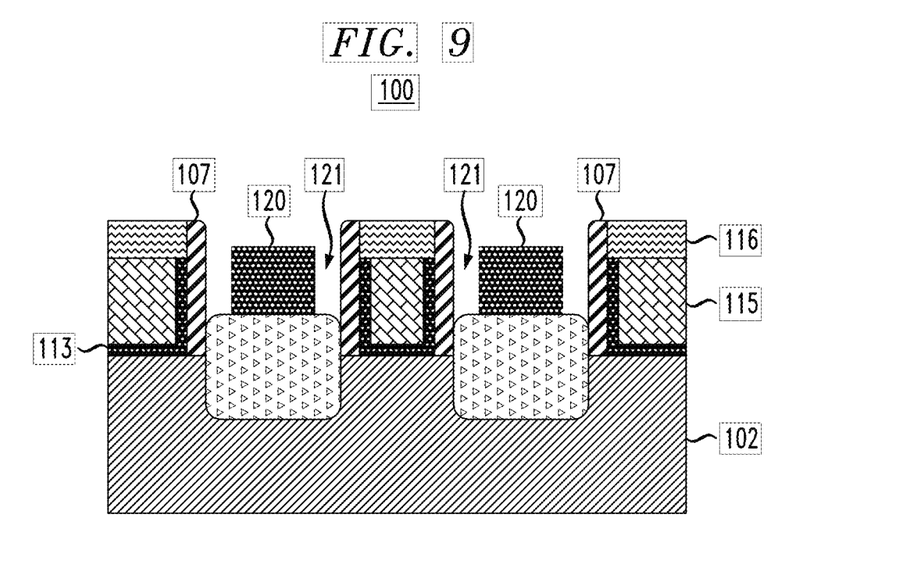
FIG. 9 is a cross-sectional view illustrating removal of the remaining portions of the sacrificial spacer layer in a method of manufacturing a semiconductor device, according to an exemplary embodiment of the present invention.

Referring to FIG. 9, the remaining portions of the sacrificial spacer layer 119 are selectively removed with respect to the source/drain contact structures 120, source/drain regions 104, and the cap and gate spacer layers 116, 107. According to an embodiment, the selective removal is performed using an etching process with DI water. The removal of the remaining portions of the sacrificial spacer layer 119 leaves spaces 121 between the source/drain contact structures 120 and the adjacent gate spacers 107.

Figure 10:
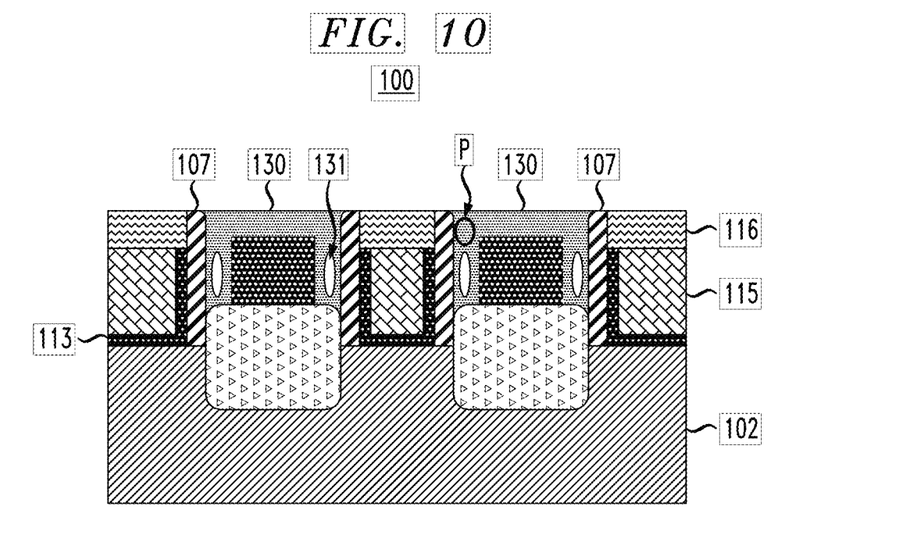
FIG. 10 is a cross-sectional view illustrating dielectric layer deposition to form air gap spacers in a method of manufacturing a semiconductor device, according to an exemplary embodiment of the present invention.

Referring to FIG. 10, a dielectric spacer material is deposited in the spaces 121 and on the source/drain contact structures 120 using a non-conformal deposition process to form air gap spacers 130, including air gaps 131 formed therein. The dielectric spacer material, such as, for example, $SiO_x$, SiOC, SiN, SiON, SiOCN, BN, SiBN or SiBCN, is deposited to fill in the spaces 121 on the opposite sides of the source/drain contact structures 120 left by the removal of the remaining side portions of the sacrificial spacer layer 119. The spacer material is also deposited on upper surfaces of the source/drain contact structures 120. In accordance with an embodiment, the dielectric spacer material is deposited using non-conformal deposition techniques including, but not limited to, PECVD, high density plasma CVD (HDP-CVD), CVD, or any suitable combination of those processes. During the non-conformal deposition process, more material is deposited at upper portions of the structure than at lower portions of the structure. As a result, upper portions of the spacer material (e.g., see circled portion P in FIG. 10) fill in (e.g., are pinched-off) before permitting the spacer material to completely fill in areas below the filled in upper portions, so that air gaps 131 are created in the spacer material. The filled in upper portions of the spacer material block additional spacer material from being formed in underlying areas, where air gaps 131 are formed instead. Given the dielectric constant of air at 1atm (1.00059), the air in air gaps 131 functions as a low-k dielectric. The air gaps 131 are positioned in the dielectric spacer material forming the air gap spacers 130, which is between the source/drain contacts 120 and the adjacent ones of the plurality of gate structures comprising the gate conductor and gate dielectric layers 115 and 113.

Figure 11:
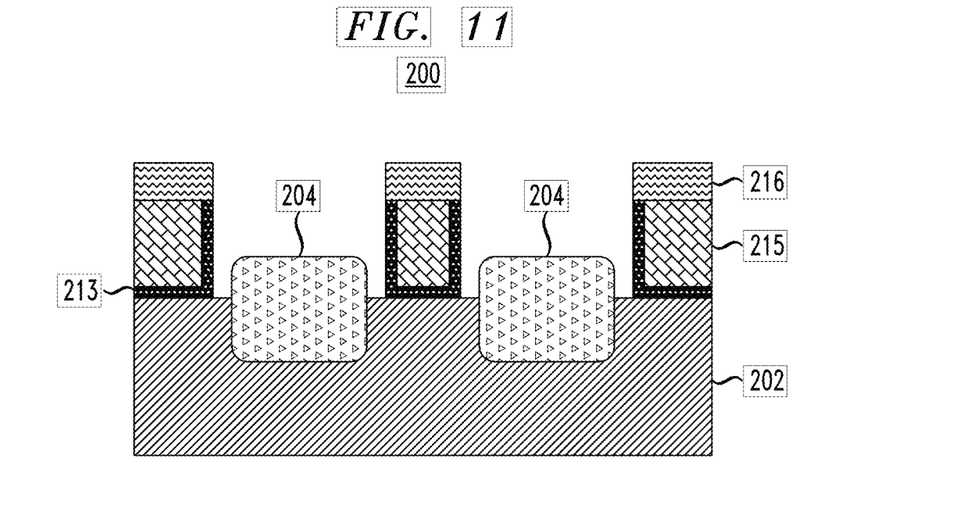
FIG. 11 is a cross-sectional view illustrating gate spacer removal following gate structure formation and ILD layer removal in a method of manufacturing a semiconductor device, according to an exemplary embodiment of the present invention.

Referring to FIG. 11, in another embodiment, following the same processing for dummy gate formation, dummy gate removal, gate structure formation and ILD layer removal described in connection with FIGS. 1-4, in device 200, gate spacers are removed after formation of gate dielectric and gate conductor layers 213 and 215. In device 100, unlike device 200, the gate spacers 107 remain throughout processing. Gate spacer removal with reference to FIG. 11 is performed using, for example, fluorine and oxygen mixed gases such as $CHF_3/O_2$ to perform selective removal of the gate spacers.

FIGS. 12-16 and 18 describe processing the same or similar to that described in connection with FIGS. 5-9 and 10, respectively, with the understanding that the gate spacers are not present in the device 200. Elements of device 200 in FIGS. 11-18 which are the same or similar to those for device 100 in FIGS. 1-10 have similar reference numerals. Duplicate descriptions of the elements and processing in FIGS. 11-18 is omitted for the sake of brevity.

Figure 12:
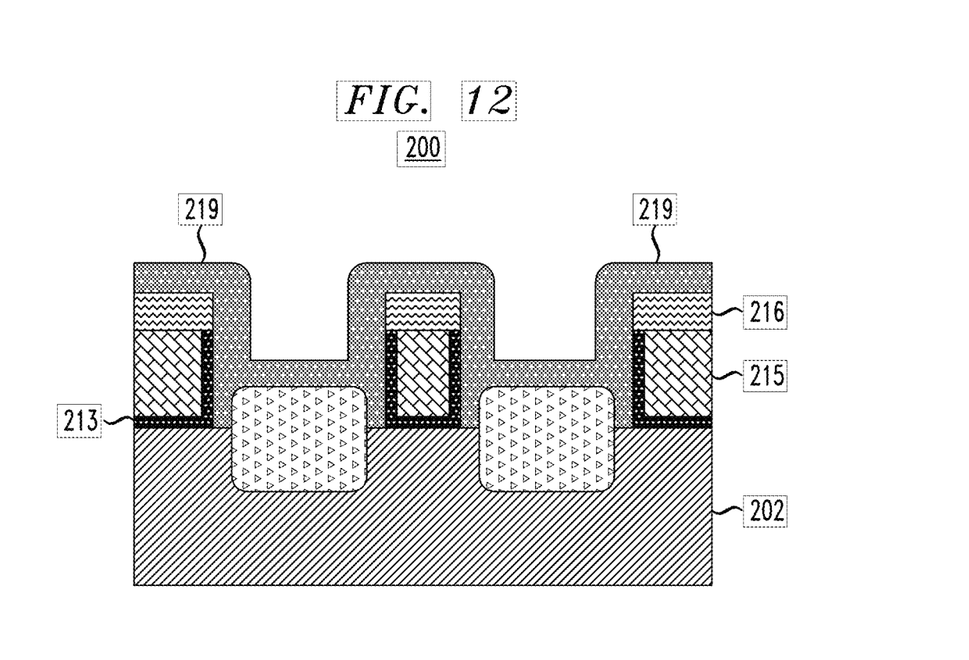
FIG. 12 is a cross-sectional view illustrating sacrificial spacer layer deposition in a method of manufacturing a semiconductor device, according to an exemplary embodiment of the present invention.

Referring to FIG. 12, a sacrificial spacer layer 219 is conformally deposited on the cap layers 216 and the source/drain regions 204. The sacrificial spacer layer 219 further fills in portions adjacent the gate dielectric layers 213 previously occupied by gate spacers. According to an embodiment, like the sacrificial spacer layer 119, the sacrificial spacer layer 219 comprises, for example, $GeO_2$, which has a relatively high etch rate in DI water, and is deposited using a conformal deposition technique such as, but not necessarily limited to, ALD or CVD. As can be seen in FIG. 12, the sacrificial spacer layer 219 is formed on vertical sides of gate dielectric layers 213, upper portions of the vertical sides of the source/drain regions 204 and on horizontal top surfaces of the source/drain regions 204. A thickness of the sacrificial spacer layer 219 is about 4 nm to about 15 nm.

Figure 13:
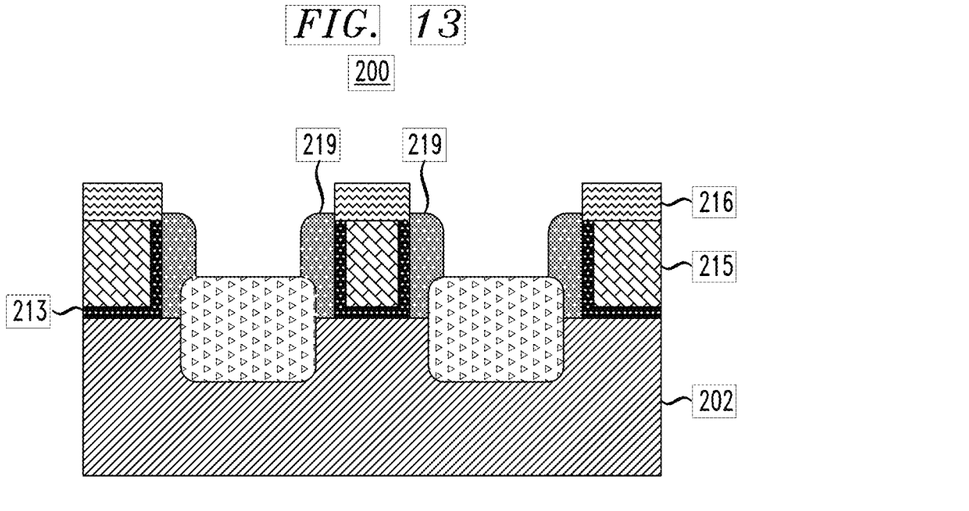
FIG. 13 is a cross-sectional view illustrating removal of portions of the sacrificial spacer layer, according to an exemplary embodiment of the present invention.

Referring to FIG. 13, portions of the sacrificial spacer layer 219 are removed to pattern the sacrificial spacer layer 219. For example, using a directional RIE process, horizontal portions of the sacrificial spacer layer 219 are removed. The ME is continued to pull down the remaining vertical side portions of the sacrificial spacer layer 219 to a vertical height below the top surfaces of the cap layers 216. The RIE is performed to remove the horizontal portions and to pull down the remaining side portions of the sacrificial spacer layer 219. As explained in more detail in connection with FIG. 14, the remaining vertical side portions of the sacrificial spacer layer 219 are pulled down to a vertical height below the top surfaces of the cap layers 216 so that subsequently deposited source/drain contact structures 220 cover the remaining vertical side portions of the sacrificial spacer layer 219 to protect them from being etched by any intervening processes (e.g., between FIGS. 14 and 15) that use DI water.

Figure 14:
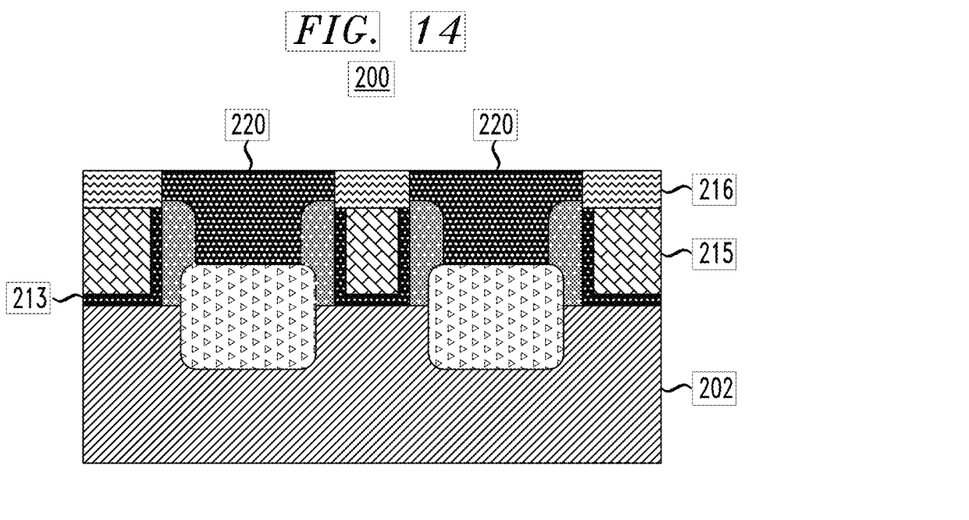
FIG. 14 is a cross-sectional view illustrating source/drain contact formation in a method of manufacturing a semiconductor device, according to an exemplary embodiment of the present invention.
Figure 15:
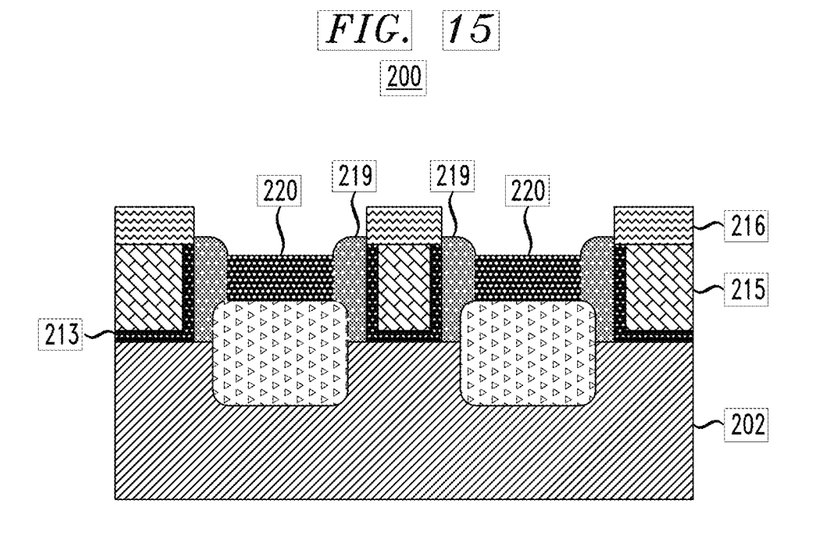
FIG. 15 is a cross-sectional view illustrating recessing of source/drain contacts to expose the remaining portions of the sacrificial spacer layer in a method of manufacturing a semiconductor device, according to an exemplary embodiment of the present invention.

Referring to FIG. 14, source/drain contact structures 220 are formed over the source/drain regions 204 and the remaining portions of the sacrificial spacer layer 219. The source/drain contact structures 220 include the same or similar contact material as the source/drain contact structures 119, and a silicide/germanide liner layer may be formed on the portions of the sacrificial spacer layer 219 and source/drain regions 204 before filling the trenches over the source/drain regions 204 with a remainder of electrically conductive material. The electrically conductive material of the source/drain contact structures 220 can be deposited using, for example, a deposition technique, such as CVD, PECVD, RFCVD, PVD, ALD, MBD, PLD, LSMCD, sputtering, and/or plating, followed by planarization down to the cap layers 216 using, for example, a planarization process such as, CMP. As noted above, the source/drain contact structures 220 cover the remaining pulled-down vertical side portions of the sacrificial spacer layer 219, which protects the remaining pulled-down vertical side portions of the sacrificial spacer layer 219 from exposure to DI water, which is used during the CMP process. Accordingly, DI water from the CMP process does not etch the covered portions of the sacrificial spacer layer 219, which, according to an embodiment, are formed of $GeO_2$.

Referring to FIG. 15, the source/drain contact structures 220 are selectively recessed to expose the remaining portions of the sacrificial spacer layer 219. Recessing of the source/drain contact structures 220 is performed using, for example, selective metal RIE to selectively remove an upper portion of each of the source/drain contact structures 220 with respect to the cap layers 216. The recessing is performed so that upper surfaces of the sacrificial spacer layer portions are exposed. According to an embodiment, a recessed vertical height of the source/drain contact structures 220 with respect to the underlying source/drain contact regions 204 is about 10 nm to about 100 nm.

Figure 16:
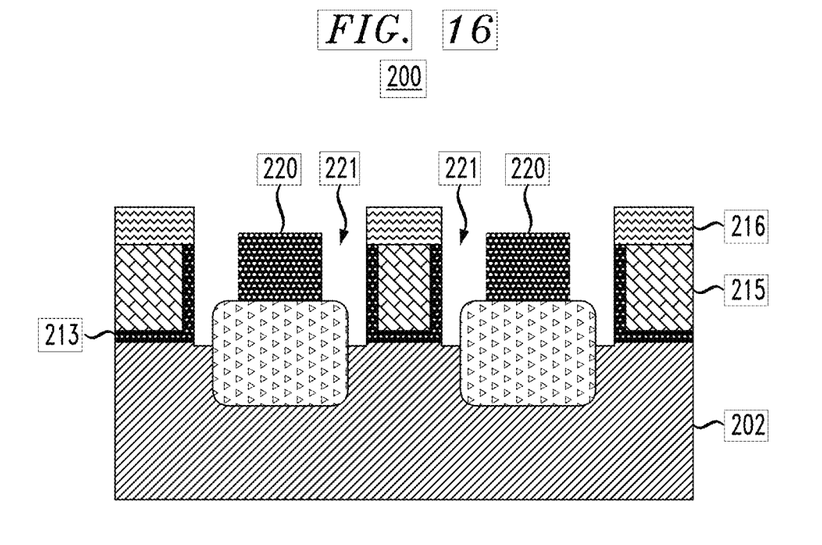
FIG. 16 is a cross-sectional view illustrating removal of the remaining portions of the sacrificial spacer layer in a method of manufacturing a semiconductor device, according to an exemplary embodiment of the present invention.

Referring to FIG. 16, the remaining portions of the sacrificial spacer layer 219 are selectively removed with respect to the source/drain contact structures 220, source/drain regions 204, and the cap and gate dielectric layers 216, 213. According to an embodiment, the selective removal is performed using an etching process with DI water. The removal of the remaining portions of the sacrificial spacer layer 219 leaves spaces 221 between the source/drain contact structures 220 and source/drain regions 204 and the adjacent gate dielectric layers 213.

Figure 17:
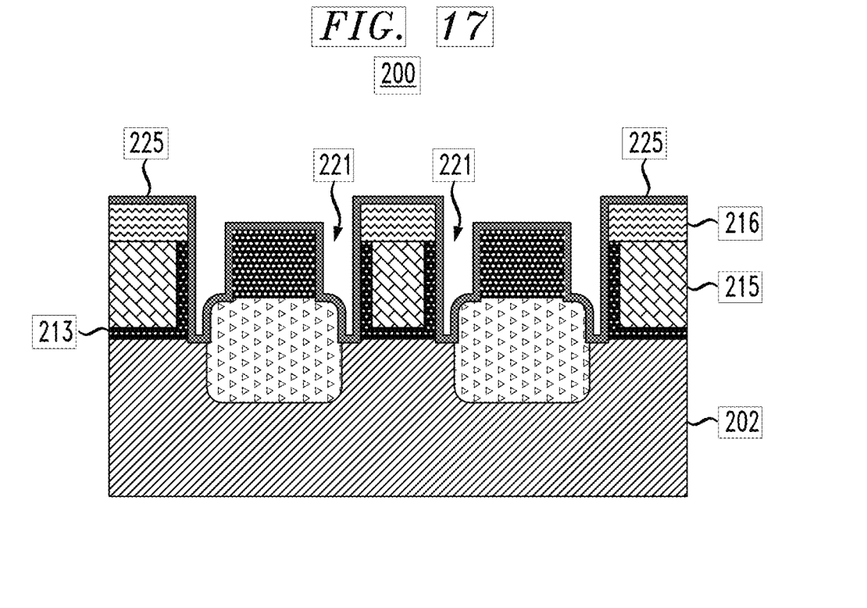
FIG. 17 is a cross-sectional view illustrating liner layer deposition in a method of manufacturing a semiconductor device, according to an exemplary embodiment of the present invention.

Referring to FIG. 17, a dielectric liner layer 225 is conformally deposited on exposed surfaces of the cap layers 216, the gate dielectric layers 213, the fin 202, the source/drain regions 204, and the source/drain contact structures 220. According to an embodiment, the liner layer 225 is deposited using a conformal deposition process, such as, for example, ALD or CVD, and includes, but is not necessarily limited to, SiN, SiON, SiOCN, BN, SiBN or SiBCN. The liner layer 225 protects the underlying layers during subsequent non-conformal deposition of dielectric spacer material to form air gap spacers 230. The liner layer 225 is relatively thin, having a thickness of about 2 nm to about 6 nm.

Figure 18:
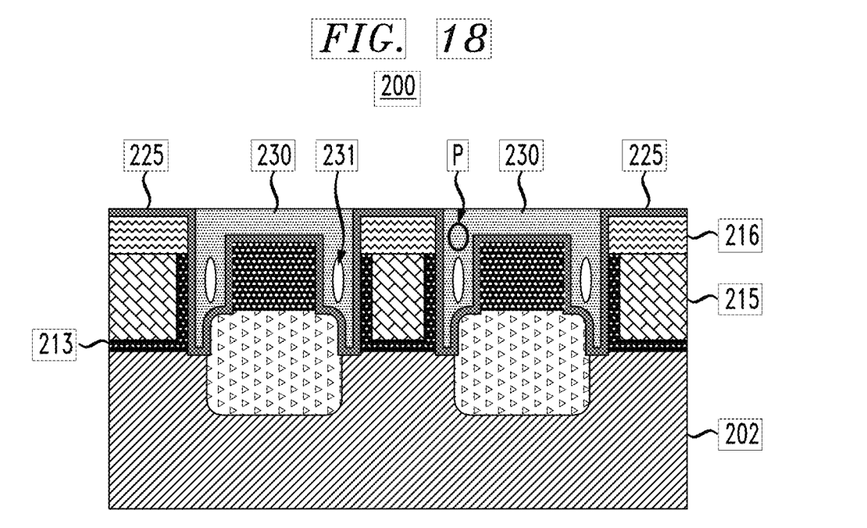
FIG. 18 is a cross-sectional view illustrating dielectric layer deposition to form air gap spacers in a method of manufacturing a semiconductor device, according to an exemplary embodiment of the present invention.

Referring to FIG. 18, a dielectric spacer material is deposited on the liner layer 225 in the spaces 221 and on the source/drain contact structures 220 using a non-conformal deposition process to form air gap spacers 230, including air gaps 231 formed therein. The dielectric spacer material, such as, for example, $SiO_x$, SiOC or other low-k dielectric material, is deposited to fill in the spaces 221 on the opposite sides of the source/drain contact structures 220 and opposite portions of sides of the source/drain regions 204 left by the removal of the remaining side portions of the sacrificial spacer layer 219. The spacer material is also deposited on upper surfaces of the source/drain contact structures 220. In accordance with an embodiment, the dielectric spacer material is deposited using non-conformal deposition techniques including, but not limited to, PECVD, HDP-CVD, CVD, or any suitable combination of those processes. During the non-conformal deposition process, more material is deposited at upper portions of the structure than at lower portions of the structure. As a result, upper portions of the spacer material (e.g., see circled portion P in FIG. 18) fill in (e.g., are pinched-off) before permitting the spacer material to completely fill in areas below the filled in upper portions, so that air gaps 231 are created in the spacer material. The filled in upper portions of the spacer material block additional spacer material from being formed in underlying areas, where air gaps 231 are formed instead. Given the dielectric constant of air at 1 atm (1.00059), the air in air gaps 231 functions as a low-k dielectric. The air gaps 231 are positioned in the dielectric spacer material forming the air gap spacers 230, which is between the source/drain contacts 220 and the adjacent ones of the plurality of gate structures comprising the gate conductor and gate dielectric layers 215 and 213.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A method for manufacturing a semiconductor device, comprising:

forming a plurality of gate structures on a semiconductor fin;

forming a plurality of cap layers on the plurality of gate structures;

forming a plurality of source/drain regions adjacent the plurality of gate structures;

depositing a sacrificial spacer layer on the plurality of source/drain regions;

removing a first portion of the sacrificial spacer layer to expose portions of the plurality of source/drain regions;

wherein removing the first portion of the sacrificial spacer layer leaves remaining portions of the sacrificial spacer layer on parts of top surfaces of the plurality of source/drain regions;

wherein the remaining portions of the sacrificial spacer layer have a height less than a height of the plurality of cap layers;

forming a plurality of source/drain contacts on the plurality of source/drain regions and on the remaining portions of the sacrificial spacer layer, wherein the remaining portions of the sacrificial spacer layer are positioned between the plurality of source/drain contacts and adjacent ones of the plurality of gate structures, and wherein portions of the plurality of source/drain contacts cover the remaining portions of the sacrificial spacer layer;

planarizing the plurality of source/drain contacts;

etching the plurality of source/drain contacts following the planarizing to a height less than the height of the plurality of cap layers to expose the remaining portions of the sacrificial spacer layer;

removing the remaining portions of the sacrificial spacer layer to form a plurality of spaces between the plurality of source/drain contacts and the adjacent ones of the plurality of gate structures, wherein the removal of the remaining portions of the sacrificial spacer layer is performed using a water-based etch; and depositing a dielectric material in the plurality of spaces, wherein the dielectric material comprises a plurality of air gaps.

2. The method according to claim 1, wherein the sacrificial spacer layer comprises germanium oxide.

3. The method according to claim 1, wherein the sacrificial spacer layer is conformally deposited on the plurality of source/drain regions and on the plurality of gate structures.

4. The method according to claim 1, wherein the dielectric material is non-conformally deposited in the plurality of spaces.

5. The method according to claim 4, wherein the dielectric material is non-conformally deposited on the plurality of source/drain contacts.

6. The method according to claim 1, wherein the plurality of air gaps are positioned in the dielectric material between the plurality of source/drain contacts and the adjacent ones of the plurality of gate structures.

7. The method according to claim 1, wherein a plurality of gate spacers are formed on the plurality of gate structures between the dielectric material comprising the plurality of air gaps and the plurality of gate structures.

8. The method according to claim 1, wherein a dielectric liner layer is formed on the plurality of gate structures between the dielectric material comprising the plurality of air gaps and the plurality of gate structures.

9. A method for manufacturing a semiconductor device, comprising:

forming a plurality of gate structures on a semiconductor fin;

forming a plurality of cap layers on the plurality of gate structures;

forming a plurality of source/drain regions on sides of the plurality of gate structures;

conformally depositing a sacrificial spacer layer on the plurality of source/drain regions and on the plurality of gate structures, wherein the sacrificial spacer layer comprises germanium oxide;

removing a first portion of the sacrificial spacer layer, wherein the removal exposes portions of the plurality of source/drain regions;

wherein removing the first portion of the sacrificial spacer layer leaves remaining portions of the sacrificial spacer layer on parts of top surfaces of the plurality of source/drain regions;

wherein the remaining portions of the sacrificial spacer layer have a height less than a height of the plurality of cap layers;

forming a plurality of source/drain contacts on the plurality of source/drain regions and on the remaining portions of the sacrificial spacer layer, wherein the remaining portions of the sacrificial spacer layer are positioned between the plurality of source/drain contacts and adjacent ones of the plurality of gate structures, and wherein portions of the plurality of source/drain contacts cover the remaining portions of the sacrificial spacer layer;

planarizing the plurality of source/drain contacts;

etching the plurality of source/drain contacts following the planarizing to a height less than the height of the plurality of cap layers to expose the remaining portions of the sacrificial spacer layer;

removing the remaining portions of the sacrificial spacer layer to form a plurality of spaces between the plurality of source/drain contacts and the adjacent ones of the plurality of gate structures; and non-conformally depositing a dielectric material in the plurality of spaces and on the plurality of source/drain contacts, wherein the dielectric material comprises a plurality of air gaps.

10. The method according to claim 9, wherein the plurality of air gaps are positioned in the dielectric material between the plurality of source/drain contacts and the adjacent ones of the plurality of gate structures.

11. The method according to claim 9, wherein a plurality of gate spacers are formed on the plurality of gate structures between the dielectric material comprising the plurality of air gaps and the plurality of gate structures.

12. The method according to claim 9, wherein a dielectric liner layer is formed on the plurality of gate structures between the dielectric material comprising the plurality of air gaps and the plurality of gate structures.

13. A method for manufacturing a semiconductor device, comprising:

forming a plurality of gate structures on a semiconductor layer;

forming a plurality of cap layers on the plurality of gate structures;

forming a plurality of source/drain regions adjacent the plurality of gate structures;

depositing a sacrificial spacer layer on the plurality of source/drain regions;

removing a first portion of the sacrificial spacer layer to expose portions of the plurality of source/drain regions;

wherein removing the first portion of the sacrificial spacer layer leaves remaining portions of the sacrificial spacer layer on parts of top surfaces of the plurality of source/drain regions;

wherein the remaining portions of the sacrificial spacer layer have a height less than a height of the plurality of cap layers;

forming a plurality of source/drain contacts on the plurality of source/drain regions and on the remaining portions of the sacrificial spacer layer, wherein the remaining portions of the sacrificial spacer layer are positioned between the plurality of source/drain contacts and adjacent ones of the plurality of gate structures, and wherein portions of the plurality of source/drain contacts cover the remaining portions of the sacrificial spacer layer;

planarizing the plurality of source/drain contacts;

etching the plurality of source/drain contacts following the planarizing to a height less than the height of the plurality of cap layers to expose the remaining portions of the sacrificial spacer layer;

removing the remaining portions of the sacrificial spacer layer to form a plurality of spaces between the plurality of source/drain contacts and the adjacent ones of the plurality of gate structures, wherein the removal of the remaining portions of the sacrificial spacer layer is performed using a water-based etch; and non-conformally depositing a dielectric material in the plurality of spaces and on the plurality of source/drain contacts, wherein the dielectric material comprises a plurality of air gaps.

14. The method according to claim 13, wherein the sacrificial spacer layer comprises germanium oxide.

15. The method according to claim 13, wherein the sacrificial spacer layer is conformally deposited on the plurality of source/drain regions and on the plurality of gate structures.

16. The method according to claim 13, wherein the plurality of air gaps are positioned in the dielectric material between the plurality of source/drain contacts and the adjacent ones of the plurality of gate structures.

17. The method according to claim 13, wherein a plurality of gate spacers are formed on the plurality of gate structures between the dielectric material comprising the plurality of air gaps and the plurality of gate structures.

18. The method according to claim 13, wherein a dielectric liner layer is formed on the plurality of gate structures between the dielectric material comprising the plurality of air gaps and the plurality of gate structures.

* * * * *